United States Patent
Korovin et al.

(10) Patent No.: US 9,488,681 B2
(45) Date of Patent: Nov. 8, 2016

(54) CONVOLUTION INTEGRAL FOR SYNCHRONIZED PHASOR

(75) Inventors: Oleksandr Korovin, Markham (CA); Ilia Voloh, Markham (CA); Zhiying Zhang, Markham (CA); Sridevi Mutnuri, Markham (CA); Ihab Hamour, Markham (CA)

(73) Assignee: General Electric Company, Schenectady, NY (US)

( * ) Notice: Subject to any disclaimer, the term of this patent is extended or adjusted under 35 U.S.C. 154(b) by 721 days.

(21) Appl. No.: 13/360,124

(22) Filed: Jan. 27, 2012

(65) Prior Publication Data
US 2013/0193951 A1    Aug. 1, 2013

(51) Int. Cl.
*G01R 23/02* (2006.01)
*G01R 19/25* (2006.01)

(52) U.S. Cl.
CPC .......... *G01R 19/2513* (2013.01); *Y02E 60/728* (2013.01); *Y04S 10/265* (2013.01)

(58) Field of Classification Search
CPC .. G01R 19/00; G01R 19/2513; G01R 23/02; Y02E 60/728
USPC .................. 324/76.11, 76.39; 702/49–90
See application file for complete search history.

(56) References Cited

U.S. PATENT DOCUMENTS

| | | | |
|---|---|---|---|
| 5,448,747 A * | 9/1995 | Garverick et al. ............ 711/156 |
| 6,662,124 B2 | 12/2003 | Schweitzer, III et al. |
| 7,015,597 B2 * | 3/2006 | Colby et al. ................... 307/31 |
| 7,444,248 B2 | 10/2008 | Premerlani et al. |
| 2003/0200038 A1 * | 10/2003 | Schweitzer et al. ............ 702/65 |
| 2006/0247874 A1 * | 11/2006 | Premerlani et al. ............ 702/64 |
| 2009/0088990 A1 * | 4/2009 | Schweitzer et al. ............ 702/58 |

* cited by examiner

*Primary Examiner* — Arleen M Vazquez
*Assistant Examiner* — Brent J Andrews
(74) *Attorney, Agent, or Firm* — Sutherland Asbill & Brennan LLP

(57) ABSTRACT

Systems, methods, and apparatus for providing a synchronized phasor in power system based on voltage and current measurements, sampling of the voltage and current measurements and convolving the samples with a function.

20 Claims, 5 Drawing Sheets

CONVOLUTION INTEGRAL FOR SYNCHRONIZED PHASOR

FIELD OF THE INVENTION

This invention generally relates to electrical power distribution networks, and in particular, to methods, apparatus, and systems for computing and reporting synchronized phasors at points along the network.

BACKGROUND OF THE INVENTION

Electrical distribution networks, such as the power grid conditions can be categorized by varying relationships between the current and voltage at various points of the network. Therefore, phasor measurement that provides information on both magnitude and phase of current and voltage at a point of measurement on the power grid has a significant importance for network operation. Such measurements can further be used for monitoring the performance of the power grid, monitoring and controlling power generation units, lines connecting stations and substations and used by protective relays or other devices distributed throughout the power grid. Power grids currently have a relatively significant amount of hardware supporting phasor measurement units (PMUs) on the power grid to provide phasor information based on voltage and current measurements at various points on the power grid.

There is a trend for future electrical power grids towards measuring and monitoring the phasors in a synchronized fashion based on the Institute of Electrical and Electronic Engineers (IEEE) C37.118 standard. Such synchronized phasors, also referred to as synchrophasors, typically need to be synchronized to about 1 micro-second (μs) or less across the power grid. To accomplish this by conventional methods, PMUs capable of synchronized measurements, are distributed throughout the power grid. Each PMU receives a common clock, reporting current, and voltage phasors at a sampling instance based on the received clock signal. The clock signal therefore must be delivered to each PMU with a relatively high level of Master Clock-to-PMU precision, such as for example, +/−500 nano-seconds (ns) across all PMUs on the grid. Typically clock signals from satellite systems are used for such purposes.

The use of synchronized phasor measurements can therefore require replacing legacy phasor measuring capable devices that use asynchronized sampling with phasor measuring capable devices that use synchronized sampling involving potentially significant investment.

BRIEF SUMMARY OF THE INVENTION

Certain embodiments of the invention can provide systems, methods, and apparatus for PMUs and determining synchronized phasors. Certain embodiments of the invention can further include asynchronous sampling of input signals using existing legacy hardware and timestamping asynchronously sampled signals and convolving the sampled data with a function to determine synchronized phasors. In one aspect, embodiments of the invention may allow the use of asynchronized sampling PMUs to generate synchronized phasor data. In another aspect, embodiments of the invention may allow the use of PMUs that do not sample in a synchronized manner with other PMUs to generate synchronized phasors with only software upgrades to the PMUs.

In one embodiment, a method can include receiving an input signal, repeatedly sampling the input signal with an asynchronous sampling period, and receiving a clock signal. The method can further include providing a timestamp from the clock signal to each sample of the input signal, and then convolving the samples of the input signal with a function using corresponding timestamps to determine a synchronized phasor of the input signal.

In another embodiment, a PMU can include an input port for receiving at least one input signal, at least one analog-to-digital converter for sampling each of the at least one input signals at an asynchronous sampling period, and a receiver for receiving a clock signal to timestamp each of the samples of the at least one input signals. The PMU can further include at least one circuit to perform a convolution on the samples of each of the at least one input signals with a function using corresponding timestamps to determine a synchronized phasor of each of the input signals.

In yet another embodiment, a power grid can include at least one voltage or current sensor for sensing at least one voltage or current signal and providing at least one input signal and at least one PMU. Each PMU can include an input port for receiving the at least one input signal, at least one analog-to-digital converter for sampling each of the at least one input signals at an asynchronous sampling period, a receiver for receiving a clock signal to timestamp each of the samples of the at least one input signals, and at least one circuit to perform a convolution on the samples of each of the at least one input signals with a function using corresponding timestamps to determine a synchronized phasor of each of the input signals.

Other embodiments, features, and aspects of the invention are described in detail herein and are considered a part of the claimed inventions. Other embodiments, features, and aspects can be understood with reference to the following detailed description, accompanying drawings, and claims.

BRIEF DESCRIPTION OF THE DRAWINGS

Reference will now be made to the accompanying tables and drawings, which are not necessarily drawn to scale, and wherein.

DETAILED DESCRIPTION OF THE INVENTION

Embodiments of the invention are described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Embodiments of the invention may provide apparatus, systems, and methods for improved measurements of synchronized phasors on a power grid. The improvements may entail providing synchronized phasors using preexisting hardware, such as existing protective relays, that sample input signals in an asynchronous manner. Additionally, the existing legacy protective relays that currently generate non-synchronized phasors may only require software updates that provide new algorithms for generating synchronized phasors. In one aspect, input signals, such as voltage and current measurements, can be sampled asynchronously and timestamped with a synchronized clock. The time-stamped samples can further be convolved with a function to generate a synchronized phasor. In one embodiment, the asynchronous sampling frequency can be based partly on the frequency of the input signals.

Example embodiments of the invention will now be described with reference to the accompanying figures.

Figure 1:
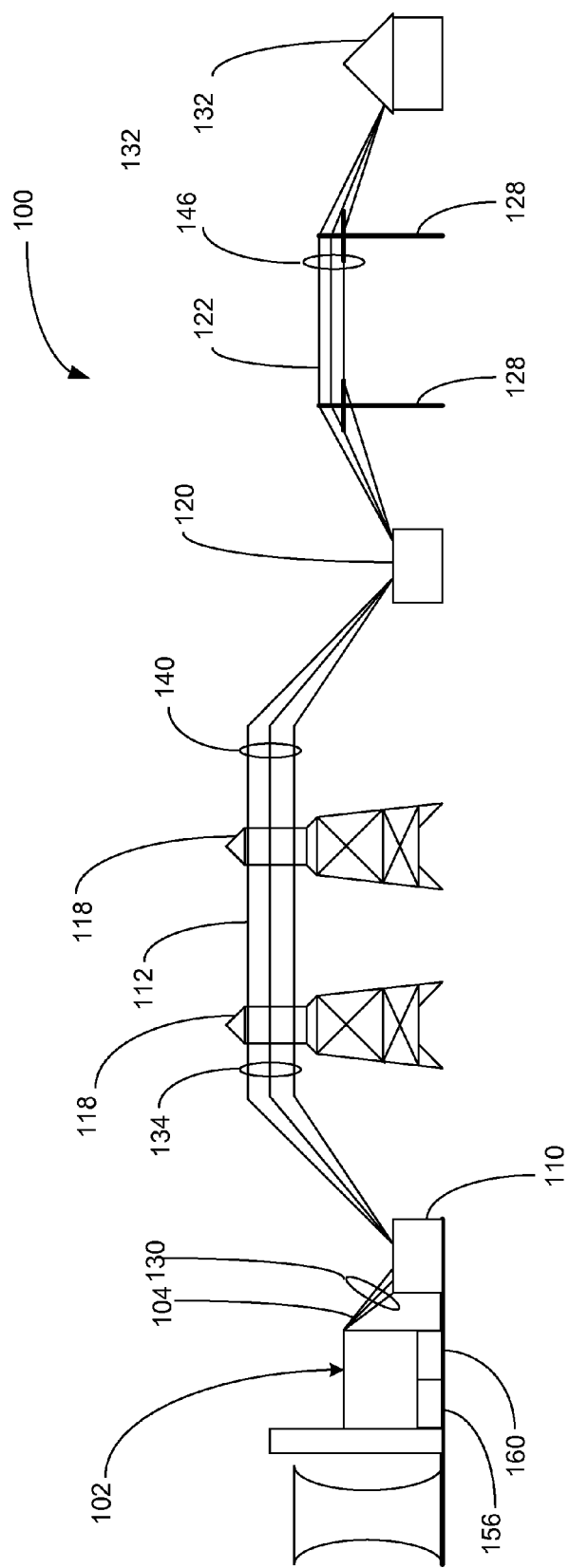
FIG. 1 is a simplified schematic diagram illustrating an example power distribution system that can be operated according to an embodiment of the invention.

Referring now to FIG. 1, a simplified schematic diagram of an example power distribution system 100 that can be operated in accordance to an embodiment of the invention can include a power generation unit 102, supplying electrical power via utility power lines 104 to a step-up transformer 110 that provides high voltage power to high voltage transmission lines 112 carried by high voltage line towers 118. The power distribution system 100 can further include a step-down transformer 120 receiving high voltage power from the high voltage transmission lines 112 and providing electrical power to distribution lines 122 carried by distribution line poles 128 to an end user 132. The high voltage transmission lines 112 and electrical power to distribution lines 122 can have points where currents and voltages on the lines can be measured using phasor measuring capable devices such as protective relays, meters, or other devices. Each of these devices can include a phase measurement unit (PMU) 130, 134, 140, and 146 that can be integrated into phasor measuring capable devices or provide standalone phasor measurement capability. In other words, the PMUs 130, 134, 140, and 146 can be integrated in, for example, a protective relay, or be a stand-alone device for determining a synchronized phasor. The PMUs 130, 134, 140, and 146 may measure current or voltage measurement signals on the utility power lines 104, high voltage transmission lines 112, distribution lines 122, or other components within the power distribution system 100. The PMUs 130, 134, 140, and 146 can calculate synchronized phasors based on the current and voltage measurements and may provide the determined synchronized phasor to a phasor data concentrator (PDC) 156. The PDC 156 can determine the system conditions based on the measurement signals from one or more of the PMUs 130, 134, 140, and 146, and provide the synchronized phasor information to a higher level PDC or super PDC 160 or control center.

It should be noted that FIG. 1 is schematic in nature and although a single power generation unit 102 is depicted, the power distribution system 100 can have multiple utilities or power generation units, providing power from a variety of energy sources. The variety of energy sources may include, but are not limited to, coal, natural gas, hydroelectric, nuclear, solar-thermal, solar photovoltaic, wind, coastal tides, geothermal, hydrogen, or combinations thereof. The power generation unit 102 may provide power to the step-up transformer 110 at a variety of voltages in the range of about 50 volts to about 25000 volts, depending on the source of energy and operational parameters of the generation unit 102. The step-up transformer 110 may provide electrical power and the high voltage transmission lines 112 may transmit electrical power in a voltage range of about 6 kilo-volts (kV) to 500 kV.

The step-down transformer 120 may receive relatively high voltage from the high voltage transmission lines 112 and provide a relatively lower voltage, such as, for example, 120 volts root mean square (Vrms) or 220 Vrms, to the distribution lines 122. In one embodiment, the step-down transformer 120 may be a part of a distribution substation that may include other elements such as surge protectors and lightning arrestors. In another embodiment, the power distribution system 100 may include multiple step-down transformers geographically spaced from each other and receive power from the high voltage transmission lines 112.

Although a single end user 132 is depicted for a simplified and conceptual view of the power distribution system 100, the power distribution system 100 may have a plurality of end users. The end users 132 may be any variety of electrical power consumers, including residential consumers and business consumers.

Although the PDC 156 and the super PDC 160 are depicted as being co-located with the power generation unit 102, in one embodiment, the PDC 156 and the super PDC 160 can be located in relatively close proximity of the PMUs 130, 134, 140, and 146, such as mounted on a high voltage line tower 118 or on a distribution line pole 128. In other embodiments, the PDC 156 can be located in proximity of the step-up transformer 110, the step-down transformer 120, a control station, or any other location where the PDC 156 can receive synchronized phasor signals from the PMUs 130, 134, 140, and 146.

Still referring to FIG. 1, the PMUs 130, 134, 140, and 146 can include any known type of current measurement device such as an ammeter or any known type of a voltage meter. The meters can provide a time series of voltage or current measurement signals to the PMUs 130, 134, 140, and 146. In certain embodiments, the PMUs 130, 134, 140, and 146 may measure current or voltage from secondary devices such as transformers and relays located on the power distribution system 100, rather than directly from power lines 104, 112, and 122.

It should be noted that although FIG. 1 only depicts four PMUs 130, 134, 140, and 146, there may be any number of PMUs in the power distribution system 100. For example, there may be a single PMU corresponding with each geographic location on the power distribution system 100. In other words, there may be a PMU associated with and receiving measurement signals from various elements of the power distribution system 100 so that synchronized phasors at these various elements and locations can be viewed concurrently.

Although in FIG. 1 the PMUs 130, 134, 140, and 146 are depicted as being on or near distribution lines 122, high voltage lines 112, and utility power lines 104, or the poles 128 or towers 118 carrying the same, the PMUs 130, 134, 140, and 146 can be located in any convenient location. For example, the PMUs 130, 134, 140, and 146 can be integrated into, for example, relays or transformers that are electrically connected to and in proximity of the various conductive lines 104, 112, and 122.

The PMUs 130, 134, 140, and 146 may provide synchronized phasor information to the PDC 156 by any known methods including, but not limited to, direct wired link or wireless link. In one embodiment, the PDC 156 may receive synchronized phasor information from more than one PMU 130, 134, 140, and 146. Furthermore the PDC 156 may be communicatively coupled to client servers (not shown) to provide real time or delayed synchronized phasor information to end users for any variety of purposes, including, but not limited to, monitoring the power distribution system 100, controlling the power generation unit 102, or bringing online or taking offline additional power generation units. Although the PDC 156 is depicted as being co-located with the power generation unit, the PDC 156 can be located in any location where the PDC 156 can be provided with data from one or more PMUs 130, 134, 140, and 146 and can be accessed by end users.

Figure 2:
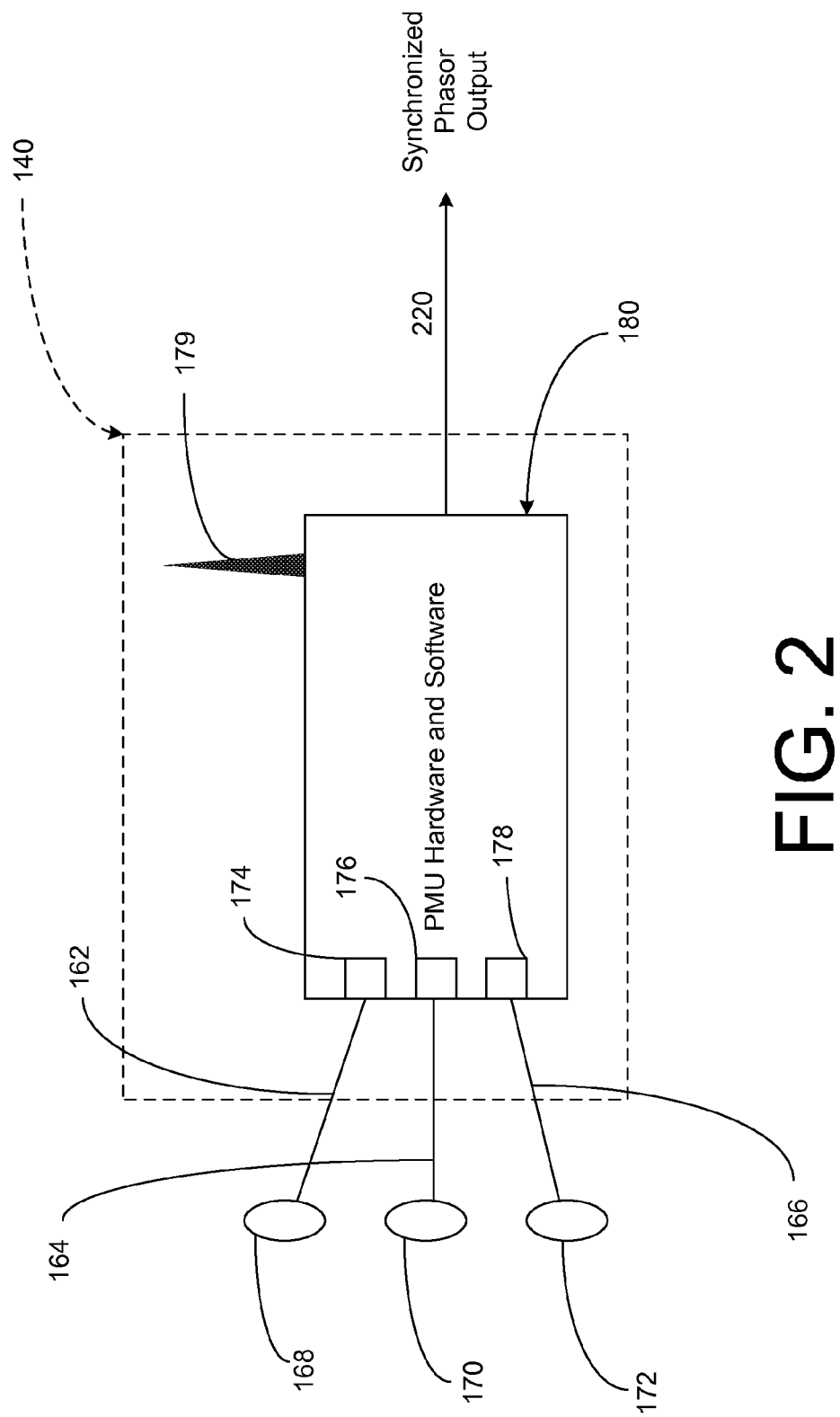
FIG. 2 is a schematic diagram illustrating an example PMU that can be used to determine a synchronized phasor measurement on the power distribution system of FIG. 1 according to an embodiment of the invention.

Referring now to FIG. 2, an example PMU 140 according to an embodiment of the invention is shown to be communicatively coupled via communication links 162, 164, and 166 to one or more meters 168, 170, and 172, respectively, to receive measurement signals from the meters 168, 170, and 172. The communication links 162, 164, and 166 can be any variety of known links including, but not limited to, direct wire coupling and wireless coupling. The communication links 162, 164, and 166 may be connected to input ports 174, 176 and 178 for receiving at least one input signal, respectively. The PMU 140 can further include a receiver 179 for receiving a clock signal. The receiver 179 can include an antenna along with associate receiver electronics, such as, for example, a pre-amplifier and a demodulator, as is well known in the art. The clock signal can be received by the receiver 179 from various known sources, such as from a global positioning satellite (GPS) clock signal, a National Institute of Standards and Technology (NIST) clock signal, a Global Navigation Satellite System (GLONASS) clock signal, a Compass Navigation system clock signal, a Galileo positioning system clock signal, an Indian Regional Navigational Satellite System clock signal, a Regional Navigational Satellite System clock signal, or combinations thereof. The clock signal from the receiver 179 and the measurement signals from the meters 134, 136, and 138 can be provided to PMU hardware and software 180.

In certain embodiments the receiver 179 can receive a clock signal via a wired or wireless connection from non-global navigation satellite systems (GNSS). Furthermore, in certain other embodiments of the invention, the reference clock receiver block 179 may be optional. In such embodiments, a reference clock signal may be provided to PMU 140 over one or more special ports, such as Irig-B or pulse per second (PPS) or over network connections, such as Network Time Protocol or Precision Time Protocol (IEEE 1588).

Figure 3:
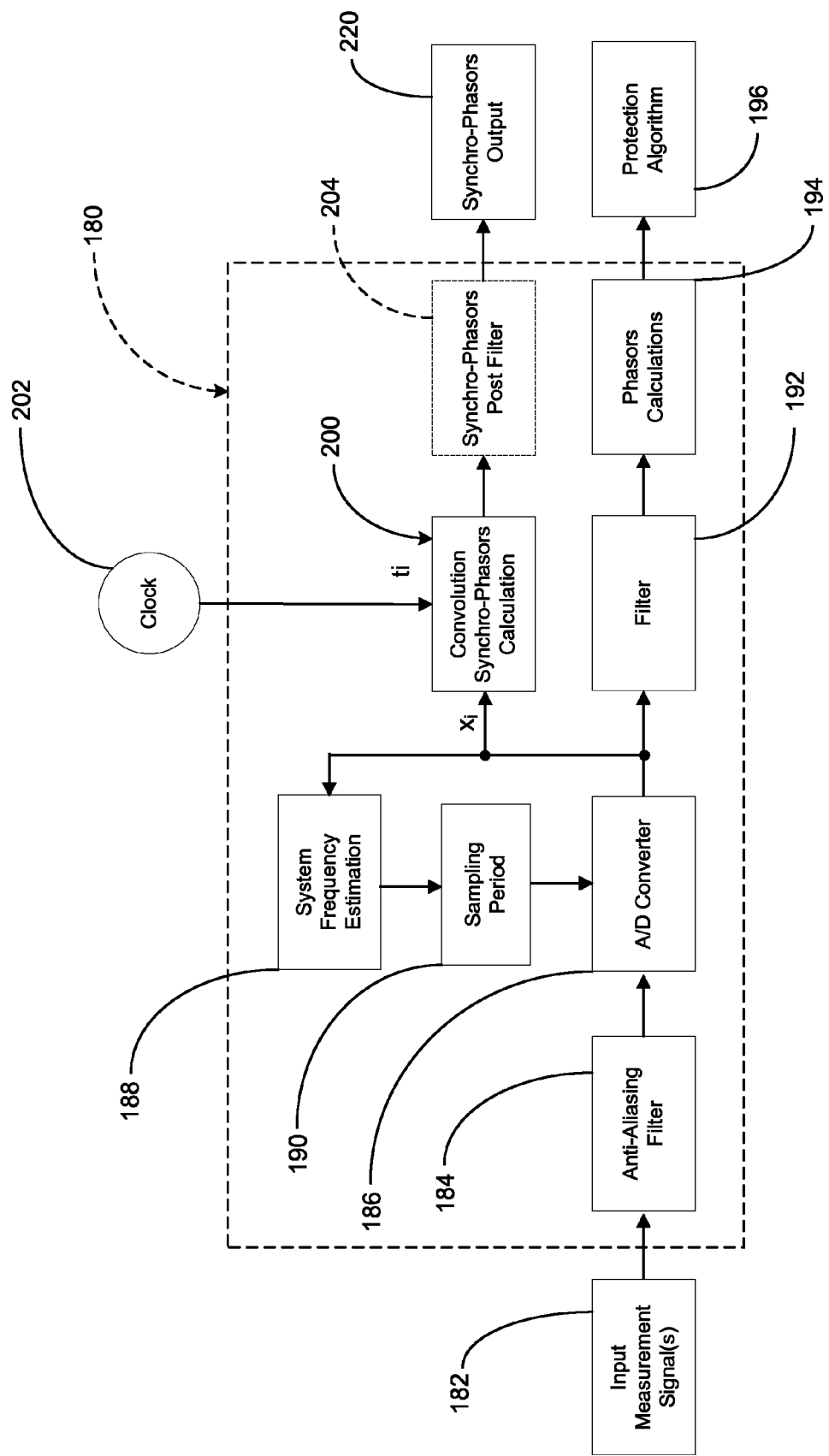
FIG. 3 is a block diagram representation of the example PMU of FIG. 2 with a convolution synchrophasors calculation unit operated in accordance with an embodiment of the invention.

Referring now to FIG. 3, an analog PMU hardware and software 180 is described as constituent functional blocks. Input measurement signals 182 may be provided to the PMU 140 and passed through an anti-aliasing filter 184, to an analog-to-digital converter (A/D converter) 186. The output of the A/D converter 186 is a sampled input measurement signal $x_i$, that can be provided to a system frequency estimation block 188 that can estimate the frequency of the input signals 182. A sampling period block 190 can receive the frequency estimation of the measurement signals 182 and provide a sampling frequency based at least partly on the frequency estimation that is provided to the A/D converter 186 for the purposes of sampling the input measurement signals 182. The A/D converter 186 sampled measurement signal $x_i$, can also be provided to a filter 192 and the output of the filter 192 can be provided to a phasor calculations block 194 which can determine a non-synchronous phasor and provide power distribution system protection algorithms 196. The protection algorithms 196 may be, for example, to control protection relays (not shown) on the power distribution system 100.

The sampled input measurement signal $x_i$ of the A/D converter 186 can further be provided to a convolution synchro-phasors calculation block 200. The convolution synchro-phasors calculation block 200 can also receive a clock signal from a clock 202 via the receiver 179. The convolution synchro-phasors calculation block 200 can pair each sampled input measurement signal $x_i$ with a corresponding timestamp $t_i$ and then use the timestamped sampled measurement $x_i$ and perform a convolution with a function. The output of the convolution synchro-phasors calculation block 200 can optionally be post filtered in a synchro-phasors post filter block 204 to provide a synchronized phasor output 220.

The anti-aliasing filter 184 can provide a mechanism for preventing sampling errors by filtering out high frequency noise and signals from the input measurement signals 182. The input measurement signals 182 may have spurious and transient signals, as well as induced noise from meters 168, 170, and 172 that can inject relatively high frequency components that when sampled at a frequency equal to or less than twice the frequency of the high frequency components may lead to aliasing errors during sampling at the A/D converter 186. As a result, the anti-aliasing filter 184 can be used to remove high frequency components from the input measurement signals 182, so that the input measurement signals 182 can significantly comply with the Nyquist-Shannon criterion in order for the sampling frequency to be used for sampling the input measurement signals 182 at the A/D converter 186.

The system frequency estimation block 188 may be implemented to estimate the frequency of the input measurement signals 182 by any known methods in either the time or frequency domains. Such techniques may include, but are not limited to, the use of triggered integrators and comparators, such as zero-crossing triggers, in the time domain or the use of digital Fourier transform (DFT) analysis in the frequency domain.

The sampling period block 190 may provide a sampling period and thereby sampling frequency to the A/D converter 186 based on the estimated system frequency determined by the system frequency estimation block 188. Therefore, the sampling frequency of the A/D converter 186 may be asynchronous. In other words, the sampling frequency of the A/D converter 186 may be determined based upon real time factors and not be predetermined.

In one embodiment, the sampling frequency may be determined as an integer multiple of the system frequency estimation. As a non-limiting example, consider that the estimated system frequency is 60 Hz as determined at the system frequency estimation block 188 and the integer multiple is 64, then the A/D converter 184 sampling frequency may be determined to be 3.84 kHz at the sampling period block 190. If the system frequency is found to drift over time, so that at a subsequent time the system frequency is found to be, for example, 61 Hz, then the A/D converter 186 sampling frequency may be determined as 3.904 kHz, at the sampling period block 190. As such, it is apparent that the sampling frequency of the A/D converter 186 in this example is not predetermined, but rather asynchronous and determined based upon one or more other parameters.

It should be noted that in certain embodiments of the invention, the system frequency estimation block 188 may be optional. In such embodiments, at block 190 a sampling period is provided to the A/D converter 186 that is asynchronous. In other words, the sampling frequency provided to the A/D converter 186 may not be linked to either the clock 202 or the system frequency. Therefore the sampled data from the A/D converter 186 must be timestamped at the convolution synchro-phasors calculation block 200 to be able to conduct the required calculations.

The A/D converter 186 can be any known type of A/D converter including, but not limited to, a ramp-compare A/D converter, an integrating A/D converter, a sigma-delta A/D converter, or the like.

The synchro-phasors post filter block 204 can filter out low frequency and high frequency noise from the output of the convolution synchro-phasors calculation block 200 to provide the synchronized phasor output 220 with reduced noise or different reporting rate. The synchro-phasors post filter block 204 may include, for example, a band pass filter. In other embodiments the synchro-phasors post filter block 204 may include a high-pass filter or a low-pass filter or reporting rate converter.

It should be noted that the PMU input measurement signals 182 may be any number of independent time series signals and the PMU 140 may process each of the input measurement signals 182 concurrently or relatively nearly concurrently. As a non-limiting example, the PMU 140 may receive eight independent or pseudo-independent input measurement signals and process all eight signals as eight channels of the PMU 140. The eight independent channel may be, for example, a current and voltage measurement at a particular location on the power distribution system 100 for a first phase, a second phase, a third phase, and a neutral connection of a three-phase power distribution system. In such a three-phase power distribution system, each of the three phases may have a relative phase of approximately 120° with each other.

In other embodiments, the input signals may be derived from current and voltage measurements on the power distribution system 100, such as, for example, at least one of the following: (i) a voltage of a power element; (ii) a current of a power element; (iii) a resistance of a power element; (iv) real power of a power element; (v) reactive power of a power element; (vi) power factor of a power element; (vii) frequency of a power element; or (viii) a rate of frequency of a power element.

The synchronized phasor output 220 of the PMU 140 may be synchronized to the clock 202. Therefore, if the power distribution system 100 has more than one PMU, then the phasors outputted by each of the PMUs may be synchronized to the clock 202 and therefore to each other.

Some legacy PMU equipment that do not generate synchronous phasors, but only non-synchronous phasors, may use asynchronous sampling of input signals. The legacy PMUs may also have the ability to receive a clock signal or can be modified to receive a clock signal. In one embodiment, the convolution synchro-phasors calculation block 200 may be implemented using existing hardware on legacy PMUs with a software upgrade to legacy PMUs. Therefore, in one embodiment, the apparatus for determining a synchronized phasor as disclosed herein may be implemented on legacy PMUs with relatively minor modifications to such systems. The relatively minor modifications required on legacy PMUs to be able to generate synchronized phasors in accordance to embodiments of the invention may be relatively less expensive than replacing legacy PMUs on the power distribution system with new PMU hardware.

It should be noted that the topology of the PMU 140 may be modified in various ways in accordance with certain embodiments of the invention. For example, in certain embodiments, one or more functional blocks may be placed and executed at a different location relative to the other functional blocks of the PMU 140. Additionally, in other embodiments, other functional blocks may be added or removed from the PMU 140.

Figure 4:
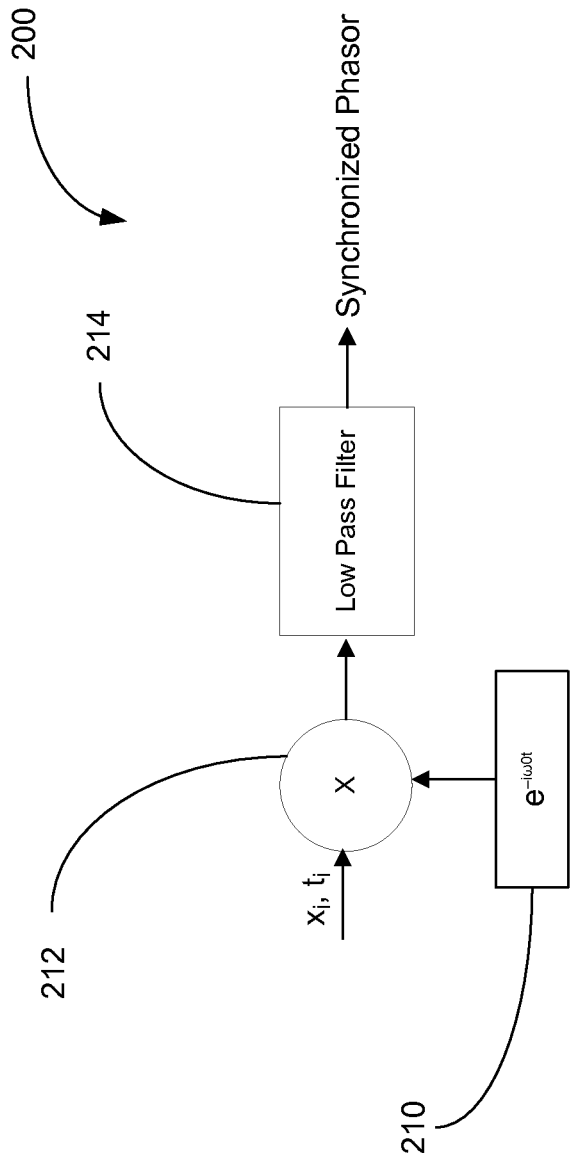
FIG. 4 is a block diagram representation of the example convolution synchro-phasors calculation unit that is part of the PMU of FIG. 2 and operated in accordance to an embodiment of the invention.

Referring now to FIG. 4, the structure of the example convolution synchro-phasor calculation block 200 is shown to include a quadrature signal ($e^{-i\omega_0 t_k}$) 210 and the time-stamped sampled input signals ($x_i$, $t_i$) provided to a multiplier block 212 that multiplies the two signals and then can provide the output of the multiplier 212 to a filter, such as a low pass filter 214 to generate a synchronized phasor output. $\omega_o$, is the nominal fundamental frequency of the power distribution system 100. For example, $\omega_o$, can be 60 Hz or 50 Hz.

The operation of the convolution synchro-phasor calculation block 200 will now be described by way of an example. Assume input signal is sinusoidal waveform:

$$x(t) = M \cdot \cos(\omega t + \phi) \tag{1}$$

Where M is the magnitude in volts (V), $\omega$ is the frequency in radians per second (rad/s), and $\phi$ is radians.

By applying Euler's identity, the input signal can be shown as:

$$x(t) = M \cdot (e^{i(\omega t + \phi)} + e^{-i(\omega t + \phi)})/2 \tag{2}$$

At the multiplier block 212, the input signal is multiplied by the quadrature signal 210 to yeild:

$$x(t) \cdot e^{-i\omega_0 t} = M \cdot (e^{i(\omega t + \phi)} + e^{-i(\omega t + \phi)}) \cdot e^{-i\omega_0 t}/2 \tag{3}$$

Equation (3) can be rewritten as:

$$x(t) \cdot e^{-i\omega_0 t} = M \cdot (e^{i((\omega - \omega_0)t + \phi)} + e^{-i((\omega + \omega_0)t + \phi)})/2 \tag{4}$$

Low pass filter 214 can remove the sum frequency component (+) to yield the synchronized phasor value:

$$Y(t) = M \cdot e^{i((\omega - \omega_0)t + \phi)}/2 \cdot \sqrt{2} \tag{5}$$

If the input signal frequency is equal to system fundamental frequency ($w = w_o$), then the magnitude and phase become time independent:

$$Y(t) = \frac{M}{\sqrt{2}} \cdot e^{i\varphi} \tag{6}$$

For a symmetrical function, F(t), as is the case with the low pass filter 214, with length T the synchronized phasor calculation can be the convolution integral as implemented by the convolution synchro-phasors calculation block 200:

$$Y(t) = \frac{1}{\sqrt{2} \cdot T} \int_{-\frac{T}{2}}^{\frac{T}{2}} F(t - \tau) \cdot e^{-i\omega_0 \tau} \cdot x(\tau) \cdot d\tau \tag{7}$$

Numerical integration algorithms may be used to determine the value of the synchro-phasor, Y(t). Any known numerical integration algorithm may be used including, but not limited to, interpolation algorithms, adaptive algorithms, or combinations thereof.

Figure 5:
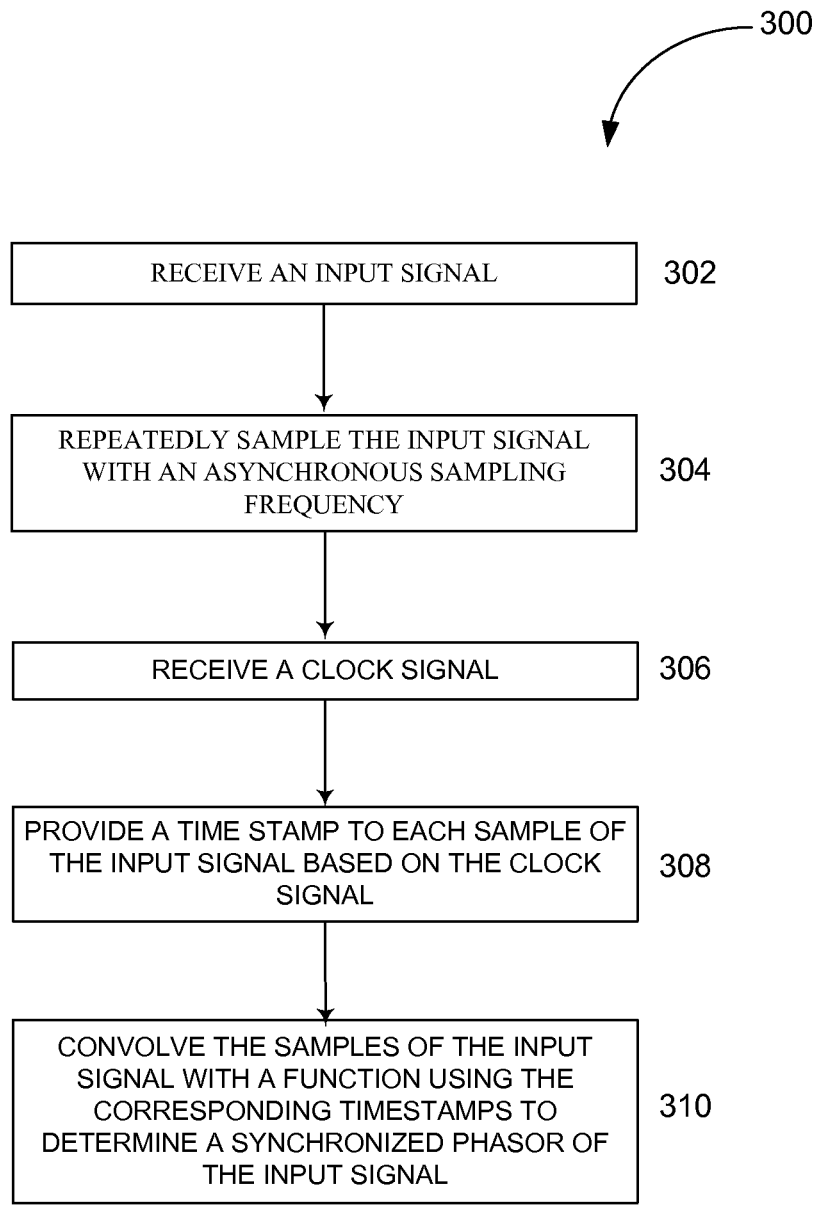
FIG. 5 is a flow diagram of an example method to generate a synchronized phasor according to an embodiment of the invention.

Referring now to FIG. 5, an example method 300 for determining a synchronized phasor of an input signal is disclosed. At block 302, an input signal may be received. The PMU 140 may receive this input signal 182 as discussed with reference to FIG. 3. At block 304, the input signal can be repeatedly sampled based on an asynchronous sampling frequency. As discussed above, the asynchronous sampling frequency may be determined by a combination of system frequency estimation block 188 and sampling period block 190. Furthermore, repeatedly sampling the input signal can be implemented with the A/D converter 186. At block 306, a clock signal is received, such as from clock 202. At block 308, a timestamp is provided to each sample of the input signal based on the clock signal. At block 310, the samples of the input signal are convolved with a function using the corresponding timestamps to determine a synchronized phasor of the input signal.

It should be noted that the method 300 may be modified in various ways in accordance with certain embodiments of the invention. For example, one or more operations of method 300 may be eliminated or executed out of order in other embodiments of the invention. Additionally, other operations may be added to method 300 in accordance with other embodiments of the invention.

While certain embodiments of the invention have been described in connection with what is presently considered to be the most practical and various embodiments, it is to be understood that the invention is not to be limited to the disclosed embodiments, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain embodiments of the invention, including the best mode, and also to enable any person skilled in the art to practice certain embodiments of the invention, including making and using any devices or systems and performing any incorporated methods. The patentable scope of certain embodiments of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The claimed invention is:

1. A method comprising:
   receiving an input signal;
   providing the input signal to an analog-to-digital converter;
   obtaining samples of the input signal by applying a sampling frequency to the analog-to-digital converter;
   providing the generated samples to a frequency estimation circuit for deriving a frequency estimate of the input signal;
   providing the frequency estimate to a sampling period circuit for generating the sampling frequency that is applied to the analog-to-digital converter;
   using a clock signal to provide a timestamp upon each sample of the input signal; and
   convolving the timestamped samples of the input signal with a function using corresponding timestamps to generate a synchronized phasor of the input signal.

2. The method of claim 1, wherein the input signal is a representation of at least one of (i) a voltage of a power element; (ii) a current of a power element; (iii) a resistance of a power element; (iv) real power of a power element; (v) reactive power of a power element; (vi) power factor of a power element; (vii) frequency of a power element; or (viii) a rate of frequency of a power element.

3. The method of claim 1, wherein the method further comprises filtering the input signal.

4. The method of claim 1, wherein the clock signal is at least one of (i) a global positioning satellite (GPS) clock signal; (ii) a National Institute of Standards and Technology (NIST) clock signal; (iii) a Global Navigation Satellite System (GLONASS) clock signal; (iv) a Compass Navigation system clock signal; (v) a Galileo positioning system clock signal; or (vi) a Regional Navigational Satellite System clock signal.

5. The method of claim 1, further comprising post-filtering of the synchronized phasor of the input signal.

6. The method of claim 1, wherein convolving the samples comprises:
   multiplying the timestamped samples of the input signal with a function that comprises a quadrature waveform to generate an output comprising a sum frequency component; and
   providing the output to a low pass filter that removes the sum frequency component and outputs the synchronized phasor of the input signal.

7. A phasor measurement unit comprising:
   an input port for receiving an analog input signal;
   an analog-to-digital converter for obtaining samples of the analog input signal;
   a frequency estimation circuit for determining from the generated samples, an estimated frequency of the analog input signal;
   a sampling period circuit for deriving from the estimated frequency of the analog input signal, an estimated sampling frequency, wherein the estimated sampling frequency is applied to the analog-to-digital converter for generating the samples of the analog input signal;
   a receiver for receiving a clock signal to timestamp each of the samples generated by the analog-to-digital converter; and
   at least one circuit to perform a convolution on the samples of the analog input signal with a function using corresponding timestamps to determine a synchronized phasor of the analog input signal.

8. The phasor measurement unit of claim 7, wherein the analog input signal is a representation of at least one of (i) a voltage of a power element; (ii) a current of a power element; (iii) a resistance of a power element; (iv) real power of a power element; (v) reactive power of a power element; (vi) power factor of a power element; (vii) frequency of a power element; or (viii) a rate of frequency of a power element.

9. The phasor measurement unit of claim 7, further comprising an input filter for filtering the analog input signal.

10. The phasor measurement unit of claim 7, wherein the at least one circuit to perform a convolution comprises a multiplier circuit that generates an output comprising a sum frequency component, and a low pass filter that removes the sum frequency component to output the synchronized phasor of the analog input signal.

11. The phasor measurement unit of claim 7, further comprising a filter for providing phasor measurements based on a local clock.

12. A power distribution system comprising:
   at least one voltage or current sensor for sensing at least one voltage or current signal and providing at least one input signal;
   at least one phasor measurement unit, each phasor measurement unit comprising:
      an input port for receiving the at least one input signal;

a frequency estimating circuit for deriving a frequency estimate of the at least one input signal by using samples of the at least one input signal;

a sampling period circuit for generating a sampling frequency based on the frequency estimate;

at least one analog-to-digital converter to which the sampling frequency is applied for generating the samples of the at least one input signal that are provided to the frequency estimating circuit;

a receiver for receiving a clock signal to timestamp each of the samples of the at least one input signal; and at least one circuit to perform a convolution on the samples of the at least one input signal with a function using corresponding timestamps to determine a synchronized phasor of the at least one signal.

13. The power distribution system of claim 12, further comprising an input filter for filtering the input signal.

14. The power distribution system of claim 12, wherein the at least one circuit to perform a convolution comprises a multiplier circuit and a low pass filter.

15. The power distribution system of claim 12, wherein the at least one voltage or current sensor comprises four voltage sensors and four current sensors for measuring eight input signals.

16. The power distribution system of claim 15, wherein the eight input signals comprise a voltage signal and a current signal from each of a first phase line, a second phase line, a third phase line, and a neutral line.

17. The method of claim 1, wherein convolving the timestamped samples of the input signal comprises:
providing to one input of a multiplier, the timestamped samples $(x_i, t_i)$ of the input signal;
providing to a second input of the multiplier, a quadrature signal $(e^{-jw_0 t_k})$ comprising a nominal fundamental frequency $(w_0)$; and
providing to a filter, an output of the multiplier, the filter configured to output the synchronized phasor of the input signal.

18. The method of claim 17, wherein the output of the multiplier comprises a sum frequency component, and wherein the filter removes the sum frequency component to output the synchronized phasor of the input signal.

19. The method of claim 18, wherein the synchronized phasor is a convolution integral.

20. The method of claim 1, wherein the sampling frequency is a variable sampling frequency that varies in correspondence to the frequency of the input signal.

* * * * *